United States Patent [19]

Leary-Renick et al.

[11] Patent Number: 4,622,058
[45] Date of Patent: Nov. 11, 1986

[54] FORMATION OF A MULTI-LAYER GLASS-METALLIZED STRUCTURE FORMED ON AND INTERCONNECTED TO MULTI-LAYERED-METALLIZED CERAMIC SUBSTRATE

[75] Inventors: Pamela A. Leary-Renick, Fishkill; Rangaswamy Srinivasan, Yorktown Heights, both of N.Y.

[73] Assignee: International Business Machines Corporation, Armonk, N.Y.

[21] Appl. No.: 844,260

[22] Filed: Mar. 25, 1986

Related U.S. Application Data

[63] Continuation of Ser. No. 623,584, Jun. 22, 1984, abandoned.

[51] Int. Cl.[4] .................... B44C 1/22; C03B 23/26
[52] U.S. Cl. .................... 65/105; 65/112; 29/847; 156/633; 156/643; 156/644; 156/654; 156/663; 219/121 LJ; 219/121 LL
[58] Field of Search ............. 156/633, 644, 654, 663, 156/643; 65/105, 112, 113; 29/847; 219/121 LJ, 121 LL

[56] References Cited

U.S. PATENT DOCUMENTS

| | | | |
|---|---|---|---|
| 3,509,624 | 5/1970 | Boucher | 29/847 |
| 3,713,922 | 1/1973 | Lepselter et al. | 156/644 |
| 4,439,270 | 3/1984 | Powell et al. | 156/644 |
| 4,478,677 | 10/1984 | Chen et al. | 156/635 |
| 4,508,749 | 4/1985 | Brannon et al. | 427/43.1 |

OTHER PUBLICATIONS

High Resolution Ultra-Violet Photoablation of $SiO_2$ Fiori et al, pp. 361, 362, Aug. 15, 1985, Am. Inst. of Physics.

Western Electric Technical Digest, No. 58, 4-80, Windows Openings in Thick Dielectric Films on Conductors, P. F. Schmidt.

*Primary Examiner*—Arthur Kellogg
*Attorney, Agent, or Firm*—Henry Powers; Steven J. Meyers

[57] ABSTRACT

In the fabrication of an interconnection package for a plurality of semiconductors or integrated circuit chips wherein a multi-layered glass or glass-ceramic superstructure with a multi-layered distribution of planar conductors is formed by a process forming vertical conductive interconnection or studs between planar conductor layers, by pre-forming a via configuration in each glass or glass-ceramic layer at the interconnection points followed by depositing the conductive studs therein. The via configuration is formed by defining a desired pattern of vias, and ablating the vias through the top of and through the glass or glass-ceramic layer, using an ultraviolet laser. The vias may be stepped-shoulder or counter-bored by using a two mask operation.

33 Claims, 12 Drawing Figures

FORMATION OF A MULTI-LAYER GLASS-METALLIZED STRUCTURE FORMED ON AND INTERCONNECTED TO MULTI-LAYERED-METALLIZED CERAMIC SUBSTRATE

This application is a continuation of copending application Ser. No. 623,584, filed on June 22, 1984 now abandoned.

FIELD OF THE INVENTION

This invention relates to semiconductor packages, and more particularly to a multi-layered package as a support for integral mounting thereon of semiconductor chips or devices.

DESCRIPTION OF THE PRIOR ART

As the integrated circuit technology advances towards large-scale integration and high performance circuits, it is necessary to provide interconnection electrical packaging which is compatible with the performance demands of associated circuitry. Thus, the problem of signal delay, package impedance, and cross-talk are extremely critical. Known prior art packaging materials often do not possess appropriate controllable dielectric properties to accommodate high performance circuits in large-scale integration schemes.

In U.S. Pat. No. 3,726,002, U.S. Pat. No. 3,968,193 and U.S. Pat. No. 4,221,047, it has been proposed to form a high-quality and high-performance multi-layered substrate supports for interconnection to semiconductor or integrated circuit devices, of fabricating a complex thin film interconnection package superstructure on a dissimilar ceramic (e.g. alumina, glass-ceramic, etc.) substrate, by forming a plurality of glass layers over the substrate, with deposition of a plurality of thin film metallization patterns on each layer of deposited glass, selectively depositing vertical conductive studs or extensions for electrical interconnection between various conductive patterns, followed by bonding a plurality of integrated circuit chips to the surface of the glass package superstructure.

Although various compatible glass compositions can be employed for the package superstructure, borosilicate glasses have found preference due, among other properties, to its low fusion temperature, excellent dielectric properties, adhesion compatibility to alumina ceramics, and resistance to subsequent processing of the package (e.g. reworking, such as bonding and/or replacement of chips or devices).

However, when borosilicate glasses have been employed, difficulty has been encountered in the use of standard photoresist masking technology to produce or form vias or feedthrough holes in the multi-component layers of these glasses, when, of substantial thicknesses. Investigation of the causes therefor indicate that the reason for this was that commonly used organic photoresists for semiconductor fabrication are not chemically durable enough to withstand the attack of etchants which are typically used and required for complete dissolution of borosilicate glass layers of substantial thicknesses, e.g., on the order of 10 microns ($\mu$). Although the patterned photoresist is normally not soluble in the glass-etchants, it floats away from the borosilicate glass dielectric surface (due to the lateral attack of the etchant along the resist/glass interface) in short periods of time (e.g., on the order of 45 seconds) when exposed to the etchant, allowing the borosilicate glass dielectric layer to be attacked in undesired areas, thereby exposing the layer to pin-holing problems and problems with undesired variations in borosilicate glass thickness, both of which could lead to electrical problems (e.g. shorts) in the final film redistribution-metal fan-out lines on the glass surfaces.

Also, as the resist is loosened and removed, as discussed above, the side walls of the via or reach-through holes becomes very shallow due to the excess undercutting of the resist, with the obtention of an acceptable via taper becoming substantially uncontrollable.

SUMMARY OF THE INVENTION

It has been discovered, in accordance with this invention, that foregoing problems, as discussed above, in forrming via formations in borosilicate glasses, can be substantially minimized, if not eliminated, by adaptation to this purpose of the ablative photodecomposition (APD) technique of D. L. Klein et al. as described in their IBM Technical Disclosure Bulletin (TDB) article "Ablative Photodecomposition Process for Repair of Line Opens", pp. 4669–4671, Vol. 26, No. 9, February 1984. In the Klein et al article the APD technique is described in its application to the selective removal of portions of resist layers. In this TDB, the resist decomposition is effected by the incidence of ultraviolet radiation of wavelengths less than 220 nm (nanometers), and power densities sufficient to cause fragmentation of resist polymer chains and the immediate escape of the fragmented portions from the resist layers. This ablation can be effected from conventional high powered pulsed sources.

For further discussions of the removal of organic films, including resists, references is made to U.S. Pat. No. 4,414,059 issued Nov. 8, 1983 to Blum et al. and U.S. Pat. No. 4,417,948 issued Nov. 29, 1983 to Mayne-Banton et al., both patents assigned to the International Business Machines Corporation.

In the invention herein, the use of a resist is *not required nor employed,* and the via pattern is formed directly with the use of a metal mask, having a pattern of openings, to screen the high energy pulsed radiation in a corresponding pattern on the borosilicate glass. Although, high powered ultraviolet pulsed radiation represents a preferred form of the invention, it is to be understood that lasers and dry etching can also be employed to form the via holes.

In a brief description of the invention, a first patterned mask (with openings of about 4 mil diameter) is superposed over the borosilicate glass film (e.g., of about 48 $\mu$m thickness) which is irradiated to ablate a via part way (e.g., about 33 $\mu$m) through the glass film at about 12 Hz for 4 minutes. This is followed by substitution of a second metal mask having a pattern of 2 mil openings corresponding to the pattern of the first mask, with the second mask openings concentric with the first mask openings. The borosilicate glass in the partial via is again irradiated to extend the via through the remainder (e.g., 15 $\mu$m) of the glass film to result as a counter-bored or stepped-shoulder via configuration. Where the APD technique is employed, the wavelength of the ultraviolet radiation can be in the range of about 1850 to about 2200 Å (e.g., 1930 Å) at energy pulses in the range of about 1500 to about 2000 and typically from about 500 to about 1000 mJ/cm$^2$.

Optimally, pulsed radiation sources are preferred (rather than a continuous source) in order to provide a sufficient amount of photons in the irradiated area of the glass film in a very short span of time. An illustrative example is the pulsed laser radiation produced by an ArF excimer laser providing pulses of about 10 to about 20 (e.g., 12 to 40) nanoseconds half width at the threshold energy fluences indicated above. As will be understood, and noted above, other radiation sources can be used as for example, a $CO_2$ laser emitting radiation of a wavelength in the range of about 10.2 to about 10.6$\mu$ at energy pulses in the range of about 250 in $mJ/cm^2$.

To particularize the invention, an excimer laser i.e. ArF can be used which produces ultraviolet radiation (e.g., 193 nm or 248 nm or 308 nm) to rapidly and homogeneously etch the borosilicate glass without need for photolithography or special etching atmospheres. Although borosilicate glasses have been emphasized, it is to be understood that the invention has applications to other dielectric materials, as for example, the thin film glass-ceramics described in the aforesaid U.S. Pat. No. 4,221,047. The glass-ceramics have a two-phase structure comprised of discrete particles of glass dispersed through a crystalline (e.g., predominately cordierite, 2 $MgO$—$Al_2O_3$—$SiO_2$) phase, which makes etching extremely difficult. Conventional etching processes, such as wet etching with buffered hydrofluoric acid, or reactive ion etching, have been found to be unacceptable due to anisotropic etching of the different constituents in the glass-ceramic. In addition, these two conventional processes are extremely slow, and require photolithographic etch masks. For glass-ceramics, the UV wavelength can be illustratively 193 nm.

The laser radiation incident on the surface of the dielectric (borosilicate glass) film produces etching through an undetermined mechanism. By using an appropriate mask, e.g., (a metal such as molybdenum) to selectively block the laser radiation, any suitable pattern can be etched through the dielectric film. The areas exposed to the beam can also be adjusted over a wide range. For example, by imaging through a metal mask, larger features, greater than 2.0 mil (e.g., about 4 mil) can be readily etched. Smaller features, (e.g., 2 mil or less) can be defined by reducing the image formed by passing the laser through a mask. This could be done with a lens system.

It is surmised that in APD, a large number of photons of a particular wavelength are directed to the material in a short time. The efficiency of absorption of these photons is very high to result in the decomposition of the material which produces fragmentation products in a small volume in a short amount of time. This causes a localized increase in volume which cannot be sustained, and the pressure is relieved by the process of ablation, wherein the fragments, in effect, explode and escape from the material, leaving an etched material. In this process, a rapid and large amount of fragmentation is initiated at the surface of the material in order to allow successive fragmented by-products to explode and escape as the ablative-etching proceeds into the material. The process in such that portions of the incident energy is transferred as kinetic energy of the ablated by-products.

Also, it is to be understood, that the process is not to be considered as limited to the ablative etching of single dielectric (e.g., borosilicate, glass-ceramic, etc.) films in that they are explicitly comprehended for the formation of the superstructure films described in the patents noted above (for example, U.S. Pat. No. 4,221,047). After ablative-etching of a first dielectric film, new layers can be deposited and fired on top of existing films, at any time, resulting, after fusion, in a continuous homogeneous structure. By ablative pattern-etching the dielectric film, with the laser, and then depositing conductive metallurgy into the vias or grooves generated, a planar structure can be obtained. The process can then be repeated any number of times required.

As background of the foregoing, attention is directed to the noted D. L. Klein et al. article "Ablative Photodecomposition Process for Repair of Line Opens", pp. 4669–4671, in the IBM Technical Disclosure Bulletin, Vol. 26, No. 9, February 1984; U.S. Pat. No. 3,410,979 granted Nov. 12, 1968 for "Method and Apparatus for Drilling Holes by Means of a Focused Laser Beam" by I. F. Larsson; and U.S. Pat. No. 3,323,198 granted June 6, 1967 for "Electrical Interconnections" by S. R. Shortes.

Accordingly, it is an object of this invention to eliminate disadvantages of the prior art.

It is another object of this invention to provide a dry-etching technique for the formation of via patterns in dielectric objects or substrates without use of photoresists.

It is a further object of this invention to ablatively etch patterned recesses in dielectric materials without need of photoresists.

The foregoing and other objects, features and advantages of the invention will become more apparent from the following more particularized description of the preferred embodiments of the invention as illustrated in the accompanying drawings.

DESCRIPTION OF THE PREFERRED EMBODIMENTS

Figure 1:
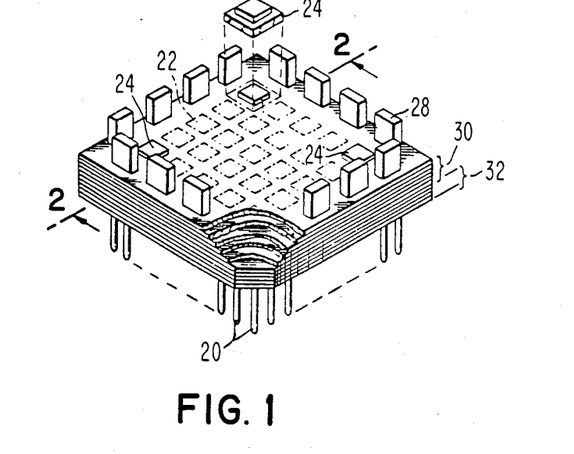
FIG. 1 illustrates a semiconductor integrated circuit package for interconnecting a plurality of semiconductor chips on a single substrate, and a perspective view is partially broken away to illustrate the manner in which the dielectric films/metal portion is constructed.
Figure 2:
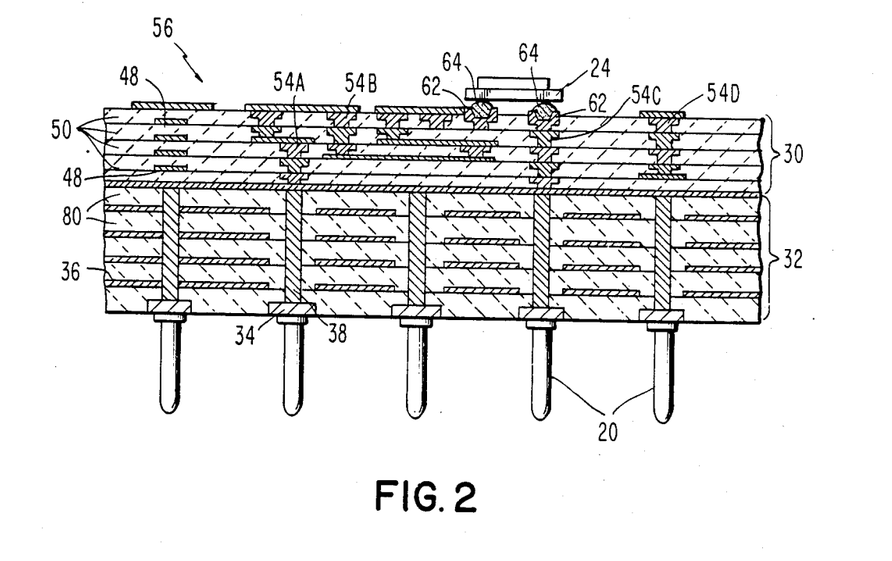
FIG. 2 is a partial cross-sectional view taken along lines 2—2, and more specifically illustrates the multi-levels of interconnection for the package.
Figure 3:
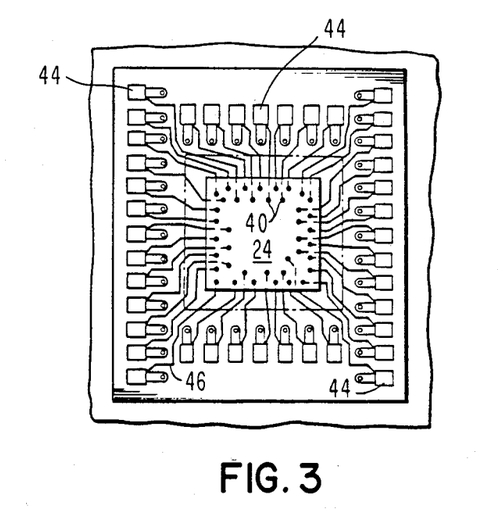
FIG. 3 is an enlarged plane view of a single chip site showing generally in FIG. 1, and illustrates the manner of interconnecting a particular chip to its upper surface metallurgy.

Referring to FIGS. 1, 2, and 3, illustrated therein are structural details of an interconnection structure necessary for communicating from the outside world via a plurality pins 20 to a plurality of chip sites 22. A plurality of chips 24 populate each chip site 22. Components, such as, capacitors 28, are readily mounted at the periphery of the package. The interconnection metallurgy, shown more specifically in FIG. 2, also establishes voltage distribution planes, ground planes, X-Y signal planes, and voltage redistribution planes. In this embodiment, a dielectric film/metal superstructure are package 30 is joined to a multi-layer ceramic base 32. A plurality of pads 34 located on the under surface of the multi-layer base 32, each connects to the pins 20. In this embodiment, the pads 34 can comprise a nickel plated tungsten metal, which have been joined to the pins 20 by brazing. It will be understood that although the base structure 32 is indicated as a ceramic base, it could be comprised of alumina ceramic or glass-ceramics and the like.

The multi-layer ceramic base 32 includes a multi-level metallization generally indicated at 36 at a plurality of planes. Further, vertical conductive paths through the multi-layer ceramic base 32 are provided by a plurality of metal-filled vias 38. The base 32 electrically functions to provide input-output connection to the pins 20 and to provide voltage distribution planes. The number of voltage distribution planes are governed by the voltage requirements of the circuit logic family existing at the chip level.

Also, the base 32 contains redistribution planes. Redistribution planes provide an interconnection translation which is necessary because of pins 20 communicating with the external world constitute a larger size grid than the grid existing at the semiconductor chip level, as represented by a plurality of paths schematically shown at 40 in FIG. 3. Also, FIG. 3 illustrates the ease with which interconnections are made from a plurality of pads 44, located on the upper surface of the dielectric film/metal module super structure 30, to the plurality of conductive lines 46. Lines 46 are formed by metal deposition steps, but upper surface connections can be further implemented by wire bonding, thermal compression bonding, etc.

The dielectric film/metal superstructure 30 comprises metallurgy planes generally shown at 48 located at multi-levels or planes separated by a plurality of insulating dielectric layers 50. Vertical interconnections between the different levels and the multi-layer ceramic substrate 32 are provided by a plurality of conductive studs 54.

Although, as indicated above, various dielectric films (such as glass-ceramic films) can be employed in this invention, this embodiment will be described with specific reference to the use of borosilicate glass films in general, and more particularly with respect to multi-component borosilicate glass dielectric films, as used in the fabrication of semiconductor devices of any type.

While not to be construed as limited, typical borosilicate glasses which can be etched in accordance with the present invention comprise primarily $SiO_2$ and $B_2O_3$, typically on the order of about 65 to 80 wt. parts silicon dioxide, about 20 to about 35 wt. parts $B_2O_3$, with up to about 20 wt. parts conventional materials as are used in such glass compositions, e.g., one or more of $Al_2O_3$, $Na_2O$, $K_2O$, $CaO$, etc. A typical multi-component borosilicate glass composition which can be employed in the present invention has the following composition, with all parts by weight percent:

| $SiO_2$ | 65.0 | $Na_2O$ | 3.0 |
|---|---|---|---|
| $B_2O_2$ | 20.0 | $K_2O$ | 5.0 |
| $Al_2O_3$ | 7.0 | $CaO$ | 1.0 |

These borosilicate glasses can have various ranges of their component, but the specific composition will be referred to as Composition A.

These borosilicate glasses can have varying thicknesses, but typically, the borosilicate glasses for purposes of this application can have film thicknesses on the order of about 10 microns and up to about 1.0 mil.

Borosilicate glass layers employed in this invention can be formed in a conventional manner as will be appreciated by one skilled in the glass art. For example, one merely mixes the various desired oxides in the desired proportion and melts them at about 1000° C. to form the desired borosilicate glass, these fused glasses are then fritted to suitable particle size to form a layer thereof by, mixing in a suitable carrier, which slurry is deposited as a layer on the surface and a glass layer formed therefrom by conventional firing procedure.

In FIG. 2, the top level metallurgy is generally designated by 56 schematically corresponding to the paths and conductive lines shown in FIG. 3, as elements 44 and 46, respectively. The semiconductor chips 24 are joined to predetermine conductive paths by a metallurgical system and solder connection illustrated at 62 and 64, respectively.

In order to allow for engineering changes, the top level metallurgy 56 is provided with engineering change pads 68. Basically, the engineering change pads 68 are comprised of a material which is softer than the metallurgy 56 itself. Accordingly, severing pressure applied on the upper surface of the metallurgy 56 in the area of the pads 68 breaks the metal line. Re-routes or engineering changes are then available by making other connections, for example, wire bonding. Only one engineering change pad 68 is illustrated; however, in actual practice, numerous pads would be located throughout the upper layer metallurgy. Pad 68 may be formed of the material such as a polyimide polymer which would cushion any severing forces, thus preventing damage to the upper dielectric film surface, but their existence is not absolutely required in all instances. Other details of this type of packaging can be obtained by reference to the patents referred to above.

FIGS. 4A–4H illustrate the process for fabricating the dielectric film/metal superstructure shown generally at 30 in FIGS. 1 and 2.

Referring to FIG. 1 the pre-formed ceramic body 80 having conductive vias 82 is lapped flat to a predetermined thickness. In this embodiment, the overall thickness of the multi-level ceramic superstructure 30, FIGS. 1 and 2, is approximately 5 mils thick, ±3 mils. It is necessary to lap the upper surface 84 to flatness or planarity within 0.1 to 0.2 mils. Lapping can be accomplished with a free or resin bonded abrasive pad followed by suitable cleaning of the ceramic body, for example, as described in the aforesaid indicated U.S. Pat. No. 3,968,193.

For purpose of illustration, in this embodiment, the ceramic base substrate 32 is comprehended to be comprised essentially of an alumina or $AL_2O_3$ composition. However, other compositions such as mullite, berylium oxide, magnesium, or other materials, (for example, the glass ceramic of the aforesaid U.S. Pat. No. 4,221,047) which have a suitable thermal conductivity and dielectric properties can be employed.

After conditioning of the upper surface of the ceramic body 80, a blanket metallization layer 36 of suitable conductive composition is deposited thereon. The deposition can be accomplished by employing three separate sequential metal evaporations comprising chromium-copper-chromium. Illustratively, for this embodiment, the metallization layer 86 can comprise a lower chrome layer of approximately 800 angstroms thickness and an overlying copper layer approximately 3 μm thick, and a top chrome layer approximately 800 angstroms thick. After deposition of the conductive sandwich, it can be subjected to selective etching operations. Suitable etching techniques can be selected to provide a personalized metallization pattern comprised of a plurality of lines 88 comprising a chrome-copper-chrome metallurgical system. Alternatively, the metal line resolution can be obtained by use of lift-off resist, E-beam blanket evaporated metal. A typical line pattern is of a 12 micrometers width on a 12 micrometer spacing between metal lines.

After delineation of the conductive metallurgical pattern 88, a borosilicate glass slurry (e.g., composition A) is deposited on the ceramic surface 80 to form, after firing, a fused layer 98 to a thickness extending well above the conductive pattern 88. The slurry can be deposited, for example, (as in the prior art noted above) by doctor blading or spraying. The slurry is formed of glass frit in a suspending medium, such as terpineol. In order to realize the desired physical and dielectric characteristics of the insulating glass layer, it is important to form the glass slurry into a homogeneous and uniform dispersion.

The deposited glass slurry layer is dried to drive off the suspending medium and then fired to fuse the glass particles together.

Figures 4A, 4B:
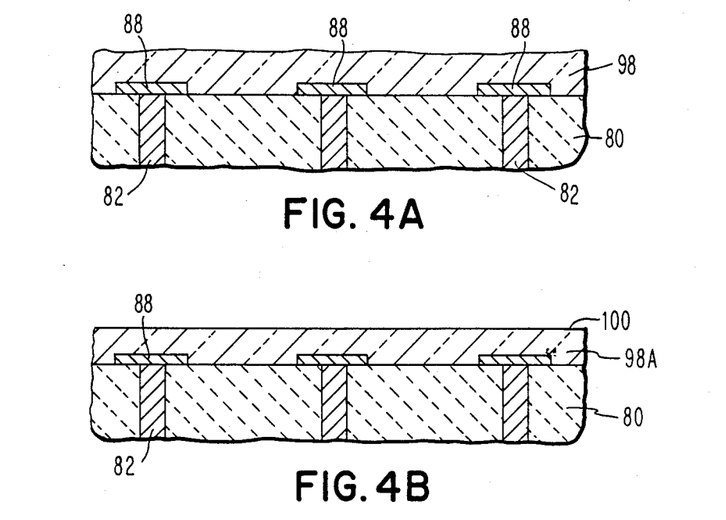
FIGS. 4A–4H are schematic step-by-step cross-sectional views illustrating a preferred embodiment for fabricating the dielectric film/metal portion of the overall superstructure portion of the interconnection package.

After the layer 98 is cooled, it is necessry to condition the upper surface prior to subsequent steps. As illustrated in FIG. 4B, the glass layer 98 is lapped to provide an upper planar surface 100. The lapping operation serves several functions. Firstly, it provides for (1) planar surface and (2) a surface finish necessary for subsequent operations. Whether it allows exact (3) thickness control of layer 98. Thereafter, the upper surface 100 may be refired to remove any flaws caused by the lapping operation.

Figure 4C:
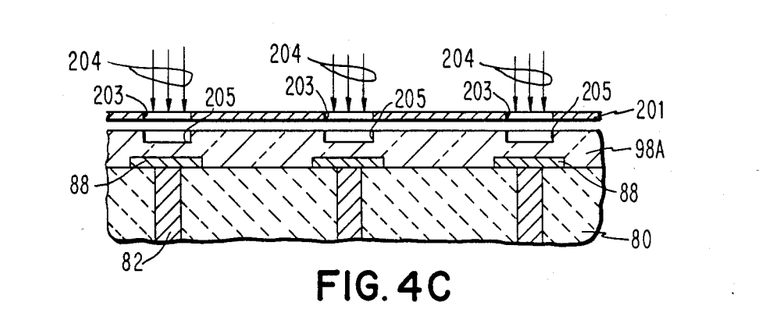

In the next operation, a metal mask 201 (e.g., of molybdenum) is superposed over the lapped glass layer 98A. The mask 201 will be provided with a pattern of openings 203 in accordance with a desired pattern of vias at predetermined portions on the glass layer 98A. After superpositioning of mask 201, the surface portions of the glass layer 98A exposed by the mask openings 203 are irradiated with wavelengths of ultraviolet radiation 204 having a wavelength less than about 220 nm, (.e.g., 193 nm) to ablatively decompose portions of the glass layer 98A through only a portion of glass layer 98A wherein the bottom of the recess 205 is spaced from the bottom glass layer 98A. As will be understood, those portions to be irradiated are determined by the openings 203 in mask 201. As indicated above for purpose of this embodiment, the borosilicate glass will have the Composition A described above, with the mask openings 203 being about 4 mils. In this embodiment, the lapped glass layer 98A will have a thickness of about 48 μm, with the recess 205 formed at 12 Hz for 4 minutes which etch through 33 micrometers of the fused glass Composition A layer 98A.

Figure 4D:
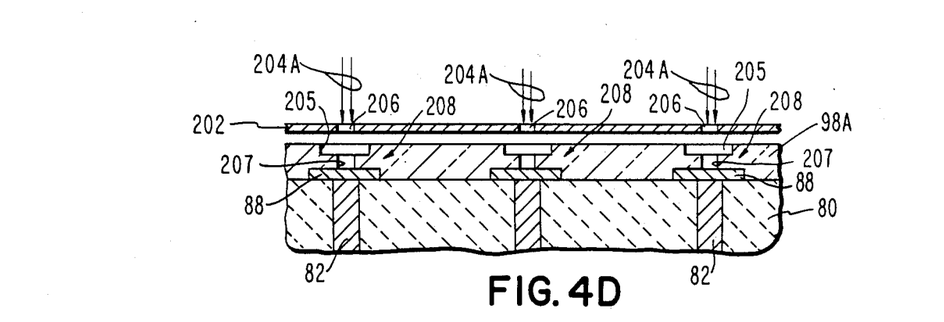

Subsequent to the formation of the recessed pattern 205, the mask 201 is substituted with a second mask 202 having smaller 2 mil openings 206. In mask 202, the openings 206 will have a pattern of openings corresponding to the 203 opening pattern of mask 301, however with the openings 206 being located concentrically with the recesses 205, so that on irradiation with ultraviolet irradiation 48 having a wavelength less than 220 nanometer (e.g., of about 193 nm), a smaller recess 207 is formed in extension to the metal pattern segments 88 as shown in FIG. 4D, the resultant via as a step-shoulder on counter board configuration 208.

Figure 4E:
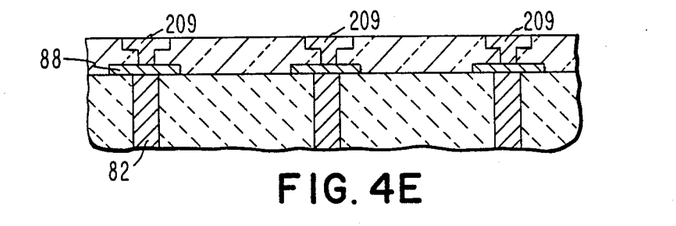

Following the formation of the pattern of step-shoulder vias 207, a suitable conductive metal can be deposited in these vias to form the vertical interconnections or studs 209.

Figure 4F:
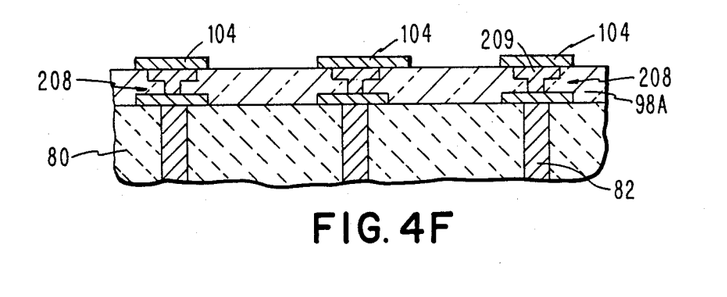
Figure 4G:
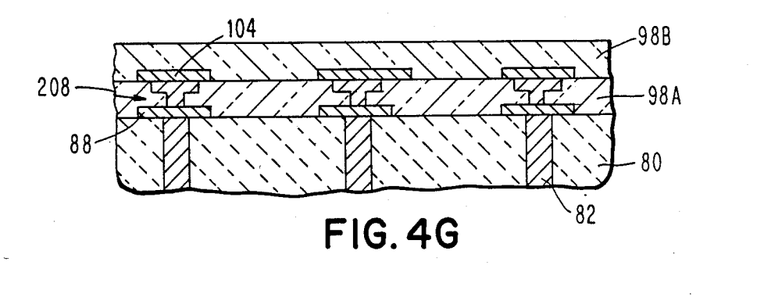

Shown in FIG. 4F is an illustration of a selective personalization of the second level metallurgy formed in a manner indentical to that previously described above. The result of this operation leaves a selective metallization pattern indicated at 104. Thereafter, the identical steps, as described above are repeated to overcoat the second level metallization 104 with a second fused borosilicate Composition A glass film which is lapped to form the second level borosilicate glass layer 98B, as shown in FIG. 4G.

Here again, the two mask procedure is employed to ablatively form the stepped-shoulder vias 208A into which are deposited conductive studs 209A.

A metal vacuum deposition step, with suitable personalization, is formed on the upper surface of metal layer 98B to form engineering change pads 140 which can also serve as a cushion for subsequent engineering changes once the entire package is chip populated. Thereafter, suitable metallization is again deposited and delineated on the top of the borosilicate glass layer 98B to form a selective metallized pattern, a portion of which is illustrated at 146. The resultant structure is illustrated in FIG. 4H, with it being understood that the metallurgy pattern 146 may comprise any sutable conductive system, and may for this specific embodiment, be comprised of a chrome-copper-chrome combination of metals.

Figure 4H:
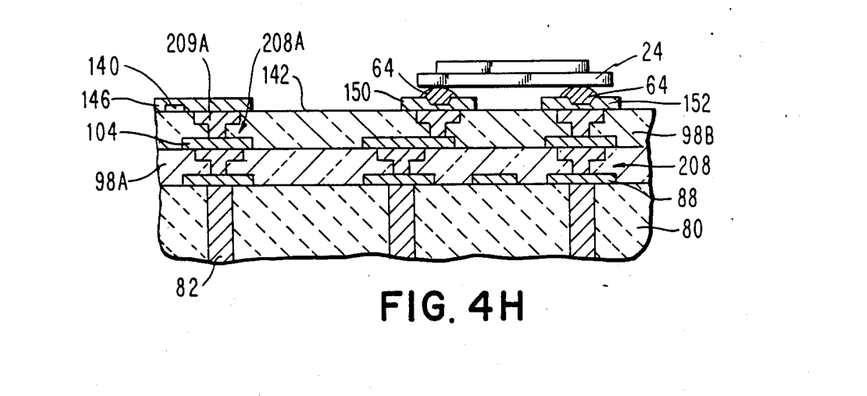

FIG. 4H also illustrates the deposition step for providing a pair of chip lands 150 and 152. In this embodiment, the chip lands 150 and 152 each comprise a chromium-copper-gold metallurgical system. Although not shown, the well known solder re-flow techniques can then be employed to join the chip pads to the respective chips as illustrated at 150 and 152. Via the solder bounds 64 which form the bond to chip 24. Chip bonding using the solder re-flow process is illustrated in U.S. Pat. Nos. 3,374,110; 3,429,949; and 3,495,133.

Although the irradiation of the dielectric or borosilicate glass layer 98A and 98B can be effected by controlled deflection of the irradiation, is to be understood that the irradiation may be effected by blanket irradiation of the glass layer 98A and 98B in suitable apparatus.

Figure 5:
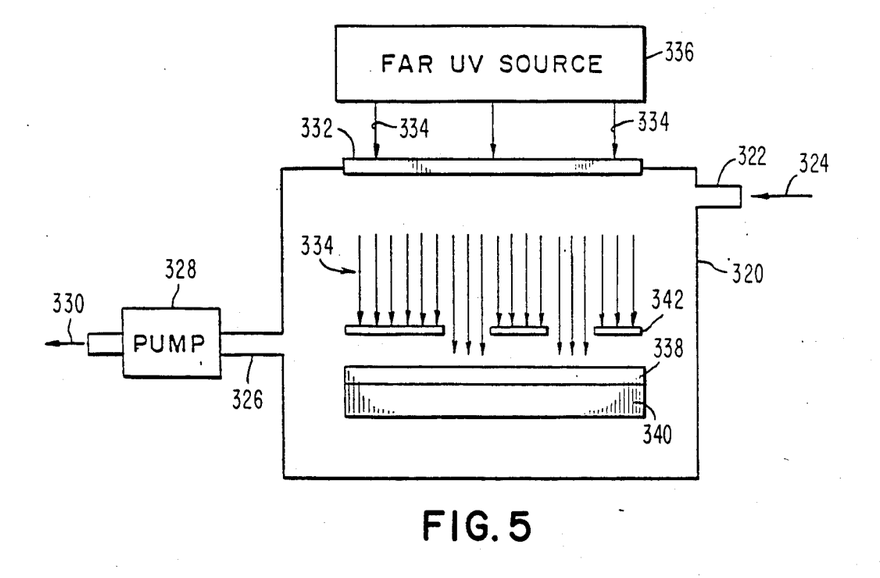
FIG. 5 is a schematic illustration of an apparatus indicated as an alternative means for employment in this invention.

FIG. 5 shows an apparatus which is suitable to carry out the ablative photodecomposition set forth in this application. This apparatus may be comprised of a vacuum chamber 320 having an input port 322 to which gasses, including air, can be admitted as indicated by the arrow 324. Chamber 320 is provided with an output port 326 to which a pump 328 is attached for removing volatile gas by-products and gasses from chamber 320 as indicated by arrow 330. A quartz window 332 allows ultraviolet irradiation 334 to enter chamber 320. This irradiation is provided by the far-UV source 336, which produces irradiation of wavelengths of about 193 or 248 or 308 nm, and a sufficient power density to produce ablative photodecomposition.

Located within chamber 320 is the substrate 340 having the superstructure 338 which is to be patterned. Substrate 340 can be comprised of a multitude of layers as discussed above, including metals, insulators and semiconductors. The superstructure layer 338 is present for purposes of patterning by ablative photodecomposition. Also shown is a mask 342 which is used to define the areas of the superstructure 338 which is to be irradiated. As noted, the UV source 336 is typically a laser source which will provide a sufficient number of photons of at least a threshold energy fluence in a very short amount of time, the amount of energy and the period of time being chosen to be sufficient to ablatively photodecompose the irradiated areas of layer 338. A suitable laser is ArF excimer laser providing the pulse output at about 193 nm. As noted, the laser source must provide a sufficient amount of energy in a short amount of time in order to cause ablative photodecomposition of the borosilicate layers. For most borosilicate glasses irradiated by ArF laser pulses 14 nanoseconds half width, it has been found that an energy fluence of 400 to 500 mJ/cm$^2$/pulse is sufficient to ablatively photodecompose the borosilicate glass.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for forming vias in a structure, wherein said structure is selected from the group consisting of glass and glass-ceramics, comprising:
    superimposing over said structure an inert first mask having a pattern of first apertures therethrough;
    masking said structure with said first mask and employing said first apertures thereof to partially ablate vias by radiating an ultraviolet laser through the top of and into said structure in the areas opposite said first apertures, with the bottom of said vias spaced a distance fom the bottom of said structure;
    replacing said first mask with a second mask having a pattern of second apertures extending therethrough, said pattern of second apertures corresponding to said pattern of said first mask with said second pattern of apertures being substantially smaller than and concentric with said first apertures; and
    employing said second apertures to completely ablate through said structure by radiating an ultraviolet laser upon areas opposite said second apertures to form vias having stepped-shoulder counter-bored configurations.

2. The method of claim 1 wherein said structure is formed on a dissimilar substrate, and said vias are formed to extend to said substrate.

3. The method of claim 1 wherein said structure is formed on a substrate comprised of a multi-layered ceramic having a pattern of a plurality of spaced and interconnected conductive planes and including a patterned conductive plane on the surface of said substrate adjacent to said structure with portions thereof selectively exposed by said vias and forming a conductive second pattern on said structure including conductive interconnections in said vias.

4. The method of claim 3 including coating said structure with a second structure selected from the group consisting of glass and glass-ceramices forming a second set of vias having a stepped-shouldered counter-bored configuration in said second structure extending to selected portions of said conductive second pattern; and forming a conductive third pattern on said second structure including conductive interconnection in said second set of vias.

5. The method of claim 4 further comprising the steps of coating said second structure with subsequent structures, forming sets of vias in each of said subsequent structures in accordance with claim 1, said sets of vias extending to conductive patterns on the structures below each subsequent structure, and forming conductive interconnection in each subsequent set of vias.

6. The method of claim 3 wherein said glass is a borosilicate glass.

7. The method of claim 1 wherein said structure is formed on a substrate comprised of a multi-layered glass-ceramic having a pattern of a plurality of spaced and interconnected conductive planes, and including a patterned conductive plane on the surface of said substrate adjacent to said structure with portions thereof selectively exposed by said vias; and forming a conductive second pattern on said structure including conductive interconnections in said vias.

8. A method for forming vias in a a multi-component glass structure consisting of:
    defining a pattern of desired via locations on one surface of said structure;
    ablating vias by directing ultraviolet radiation from an ultraviolet laser onto said pattern of desired via locations;
    said vias being ablatively photodecomposed through the top of said structure to a predetermined depth.

9. The method of claim 8 wherein said via locations are defined by masking said structure by superimposing over said structure an inert mask having a pattern of apertures therethrough; said apertures defining the desired pattern.

10. The method of claim 9 wherein the ablating of said vias by said ultraviolet laser is partial such that vias are ablated through the top of said structure in the areas opposite said mask apertures, with the bottom of said vias spaced a distance from the opposing surface of said structure.

11. The method of claim 10 wherein subsequent to said partial ablation step, said mask is replaced by a second mask having a pattern of secondary apertures extending therethrough, said pattern of secondary apertures being concentric with the apertures of the mask used in said partial ablation step, said second pattern of apertures being substantially smaller than the pattern of apertures in said partial ablation mask.

12. The method of claim 11 further comprising the step of ablating through said structure at areas opposite said secondary apertures in said second mask, forming vias having stepped-shoulder counter bored configurations.

13. The method of claim 12 wherein said structure is formed on a dissimilar substrate, and said vias are formed to extend to said substrate.

14. The method of claim 8 wherein said vias are ablated by directing radiating said ultraviolet laser upon and through said structure.

15. The method of claims 9 or 14 wherein said structure is a borosilicate glass.

16. The method of claim 15 including coating said multi-component glass structure with a second multi-component glass structure and; forming a second set of vias in said second structure.

17. The method of claim 8 wherein said structure is formed on a dissimilar substrate, and said vias are formed to extend to said substrate.

18. The method of claims 17 or 13 wherein said structure is formed on a substrate comprised of a multi-layered ceramic having a pattern of a plurality of spaced and interconnected conductive planes and including a patterned conductive plane on the surface of said substrate adjacent to said structure, with portions thereof selectively exposed by said vias and forming a conductive second pattern on said structure including conductive interconnections in said vias.

19. The method of claims 17 or 13 wherein said structure is formed on a substrate comprised of a multi-layered glass-ceramic having a pattern of a plurality of spaced and interconnected conductive planes and including a patterned conductive plane on the surface of said substrate adjacent to said structure, with portions thereof selectively exposed by said vias and forming a conductive second pattern on said structure including conductive interconnections in said vias.

20. The method of claim 18 including coating said multi-component glass structure with a second multi-component glass structure and forming a second set of vias in said second structure, extending to selected portions of said conductive second pattern; and forming a conductive third pattern on said second structure including conductive interconnection in said second set of vias.

21. The method of claim 18 including coating said multi-component glass structure with a second multi-component glass structure and forming a second set of vias having a stepped-shouldered counter-bored configuration in said second structure extending to selected portions of said conductive second pattern; and forming a conductive third pattern on said second structure conductive interconnection in said second set of vias.

22. The method of claim 19 including coating said multi-component glass structure with a second multi-component glass structure and forming a second set of vias in said second structure, extending to selected portions of said conductive second pattern; and forming a conductive third pattern on said second structure including conductive interconnection in said second set of vias.

23. The method of claim 19 including coating said multi-component glass structure with a second multi-component glass structure and forming a second set of vias having a stepped-shouldered counter-bored configuration in said second structure extending to selected portions of said conductive second pattern; and forming a conductive third pattern on said second structure, including conductive interconnection in said second set of vias.

24. The method of claim 23 further comprising the steps of coating said second multi-component glass structure with subsequent multi-component glass structures, forming sets of vias in each of said subsequent structures, said sets of vias extending to conductive patterns on the structures below each subsequent structure, and forming conductive interconnection in each subsequent set of vias.

25. A method for forming vias in a multi-component glass structure comprising:
masking said structure by superimposing over said structure an inert mask having a pattern of apertures therethrough; said apertures defining the desired pattern;
partially ablating vias by directing ultraviolet radiation from an ultraviolet laser onto said pattern of apertures;
replacing said mask with a second mask having a pattern of secondary apertures extending therethrough, said pattern of secondary apertures being concentric with the apertures of the mask used in said partial ablation step,
said second pattern of apertures being substantially smaller than the pattern of apertures in said partial ablation mask;
ablating through said structure at areas opposite said secondary apertures in said second mask, forming vias having stepped-shoulder counter bored configurations.

26. The method of claim 25, wherein said multi-component glass structure is formed on a dissimilar substrate, and said vias are formed to extend to said substrate.

27. The method of claim 26 wherein said multi-component glass structure is formed on a substrate comprised on a multi-layered ceramic having a pattern of a plurality of spaced and interconnected conductive planes and including a patterned conductive plane on the surface of said substrate adjacent to said structure, with portions thereof selectively exposed by said vias and forming a conductive second pattern on said structure including conductive interconnections in said vias.

28. The method of claim 27 wherein said multi-component glass structure is formed on a substrate comprised of a multi-layered glass-ceramic having a pattern of a plurality of spaced and interconnected conductive planes and including a patterned conductive plane on the surface of said substrate adjacent to said structure, with portions thereof selectively exposed by said vias and forming a conductive second pattern on said structure including conductive interconnections in said vias.

29. The method of claim 28 including coating said multi-component glass structure with a second multi-component glass structure and forming a second set of vias in said second structure, extending to selected portions of said conductive second pattern; and forming a conductive third pattern on said second structure including conductive interconnection in said second set of vias.

30. The method of claim 29 including coating said multi-component glass structure with a second multi-component glass structure and forming a second set of vias having a stepped-shouldered counter-bored configuration in said second structure extending to selected portions of said conductive second pattern; and forming a conductive third pattern on said second structure conductive interconnection in said second set of vias.

31. The method of claim 30 further comprising the steps of coating said second multi-component glass structure with subsequent multi-component glass structures, forming sets of vias in each of said subsequent structures, said sets of vias extending to conductive patterns on the structures below each subsequent structure, and forming conductive interconnection in each subsequent set of vias.

32. The method of claim 7 wherein said glass is a borosilicate glass.

33. The method of claim 4 wherein the first said and said second structures are comprised of borosilicate glass.

* * * * *